United States Patent [19]
Boon et al.

[11] Patent Number: 5,779,922
[45] Date of Patent: Jul. 14, 1998

[54] RESISTOR VALUE CONTROL TECHNIQUE

[75] Inventors: Paul R. Boon, Menlo Park; John D. Husher, Los Altos Hills, both of Calif.

[73] Assignee: Micrel, Incorporated, San Jose, Calif.

[21] Appl. No.: 745,925

[22] Filed: Nov. 7, 1996

[51] Int. Cl.[6] ................................................. B44C 1/22
[52] U.S. Cl. .............................. 216/16; 216/41; 216/86; 216/61
[58] Field of Search .......................... 216/16, 41, 59, 216/61, 84, 86; 438/8, 9, 10, 11, 14, 17, 18

[56] References Cited

U.S. PATENT DOCUMENTS 5,326,428  7/1994  Farnwort ........................... 438/17

Primary Examiner—William Powell
Attorney, Agent, or Firm—Skjerven, Morrill, MacPherson, Franklin & Friel; Brian D. Ogonowsky

[57] ABSTRACT

A resistivity map is prepared depicting the sheet resistance of a resistive film formed on a wafer as a function of position on the wafer. The resistivity map includes a plurality of zones each of which encompasses a specific range of resistivities of the resistive film. A mask containing numerous patterns which define associated resistors in the resistive film is divided into a plurality of zones which correspond to the plurality of zones of the resistivity map. One or more of the dimensions of the resistor patterns within each zone of the mask is automatically altered in a manner so as to compensate for the resistivity range of the corresponding zone of the resistivity map. Thus, in those portions of the resistive film where the sheet resistance is higher than the film's intended value, the width of the patterns in corresponding portions of the resistor mask are increased by an appropriate amount, thereby compensating for the higher sheet resistance. In a similar manner, in those portions of the resistive film where the sheet resistance is lower than the film's intended value, the width of the patterns in corresponding portions of the resistor mask are decreased by an appropriate amount.

7 Claims, 5 Drawing Sheets

RESISTOR VALUE CONTROL TECHNIQUE

BACKGROUND

1. Field of the Invention

The present invention relates to film resistors and specifically to compensating for process variations inherent in the formation of film resistors.

2. Description of Related Art

Typically, thin film resistors are formed by sputtering a material from a target source onto a wafer, thereby forming a film across the surface of the wafer, onto which a layer of photo-resist is then spun. Numerous masking patterns, each of which may define one or more film resistors, are formed on a mask in a well known manner. After aligning the mask with the wafer, the wafer is exposed using, for instance, ultraviolet radiation to define the above-mentioned numerous masking patterns in the photo-resist. A subsequent etching step completes the formation of the film resistors.

Conventional sputter machines are presently unable to sputter material onto a wafer in such a manner so as to form a film of uniform thickness on the wafer. In some cases, the thickness of the resultant film resistors may vary by several percent or more across the wafer. For example, when sputtering a suitable material (such as for instance TiN, SiCr, Ta/Al alloy, and so on) using a Varian 3190 sputter machine, portions of the resultant film overlying the center of the wafer may be approximately four percent thicker than those portions of the film overlying the edge of the wafer. Accordingly, the sheet resistance of this film is approximately four percent lower at the center of the wafer than at the edge of the wafer. Thus, where it is desired to form precision resistors having tolerances of less than two percent, it is imperative that such process variations be minimized.

FIG. 1 is a graph illustrating the resistivities of various concentric zones 11-16 of a resistive film formed on a wafer 10. This graph is known as a resistivity map and is prepared in a well known manner using a Prometrix Omnimap machine available from Prometrix Corporation of Santa Clara, Calif. Note that although the resistivity map shown in FIG. 1 has six zones 11-16, the Prometrix Omnimap machine may be programmed so as to create a resistivity map having a greater number of zones by reducing the range of resistances for each zone or a fewer number of zones by increasing the range of resistances for each zone.

Referring to the "bulls-eye" pattern of the graph of FIG. 1, the sheet resistance of the film increases as one moves from the center of wafer 10 to the edge of wafer 10. The "+" and "−" symbols in FIG. 1 indicate those portions of the film having resistances higher and lower, respectively, than the intended sheet resistance of the film. Thus, although each resultant chip is fabricated in subsequent steps using identical masking patterns, film resistors formed on those chips cut from zone 11 of wafer 10 will be of a higher resistance than those formed on chips cut from zone 12 of wafer 10.

It is also known that variations in the thickness of films formed by different sputter machines may be dramatically different, as may be verified by comparing resistivity maps of films formed using different sputter machines. For example, FIG. 2 is a resistivity map generated by a Prometrix Omnimap machine of a film sputtered onto a wafer 20 using another conventional sputter machine which simultaneously sputters material onto numerous wafers positioned along the periphery of a rotating circular plate. In this case, the sheet resistance of the substantially linear zones increases as one moves from the flat 20a of wafer 20 along a diametric line towards an opposite edge of wafer 20. Note that the slight curvature of the zones shown in FIG. 2 results from the rotating motion of the plate upon which wafer 20 rests during sputter deposition.

It is further known that the thickness and thus the sheet resistance of film resistors sputtered onto a wafer using the same sputter machine also varies as the target material is depleted over time.

The above-described variations in sheet resistance of film resistors resulting from imperfections in sputter technology undesirably limit the accuracy with which such film resistors may be fabricated. As a result, laser trimming techniques are often employed where it is necessary to fabricate precision resistors, i.e., resistors which can be guaranteed not to deviate from an intended resistance value by more than approximately one percent. However, laser trimming techniques are both expensive and time consuming. Further, the aging and annealing effects resulting from laser trimming may degrade the performance of the resistor's host circuit. The partially "zapped" material around the edge of the laser-ablated cut path will often have properties different from those of the undisturbed material further away from the laser-ablated regions. Moreover, the resistance of the partially zapped material will age at a different rate than will the remaining portions of the resistor. As a result, the IC may drift out of specification after prolonged usage.

SUMMARY

A method is disclosed herein which significantly compensates for process variations inherent in the formation of resistive films. In accordance with the present invention, a resistivity map is prepared depicting the sheet resistance of a resistive film formed on a wafer as a function of position on the wafer. The resistivity map includes a plurality of zones each of which encompasses a specific range of resistivities of the resistive film. A mask containing numerous patterns which define associated resistors in the resistive film is divided into a plurality of zones which correspond to the plurality of zones of the resistivity map. One or more of the dimensions of the resistor patterns within each zone of the mask is altered in a manner so as to compensate for the resistivity range of the corresponding zone of the resistivity map. Thus, in those portions of the resistive film where the sheet resistance is higher than the film's intended value, the widths of the patterns in corresponding portions of the resistor mask are increased by an appropriate amount, thereby compensating for the higher sheet resistance. In a similar manner, in those portions of the resistive film where the sheet resistance is lower than the film's intended value, the widths of the patterns in corresponding portions of the resistor mask are decreased by an appropriate amount.

DETAILED DESCRIPTION

Present embodiments which compensate for process variations in sputter machines are described below with reference to a Varian 3190 sputter machine for simplicity only. Further, the embodiments described below may be used to compensate for process variations associated with the formation of resistive films of any suitable material. Thus, it is to be understood that the teachings provided herein are equally applicable to any sputter machine available from any manufacturer.

Where it is desired to improve the precision with which film resistors are formed, the sputter machine to be used in forming a film on a wafer, i.e. the Varian 3190, is first used to sputter a suitable material upon a test substrate such as a silicon wafer, where the resultant resistive film is intended to have a uniform sheet resistance of X $\Omega/\square$. However, due to process variations of the Varian 3190 machine in sputtering the material onto the wafer discussed above, the resultant resistive film is not of a uniform thickness. Indeed, some portions of the resistive film may be five percent or more thicker than other portions of the resistive film. Accordingly, the resultant resistive film is not of a uniform sheet resistance.

Figure 1:
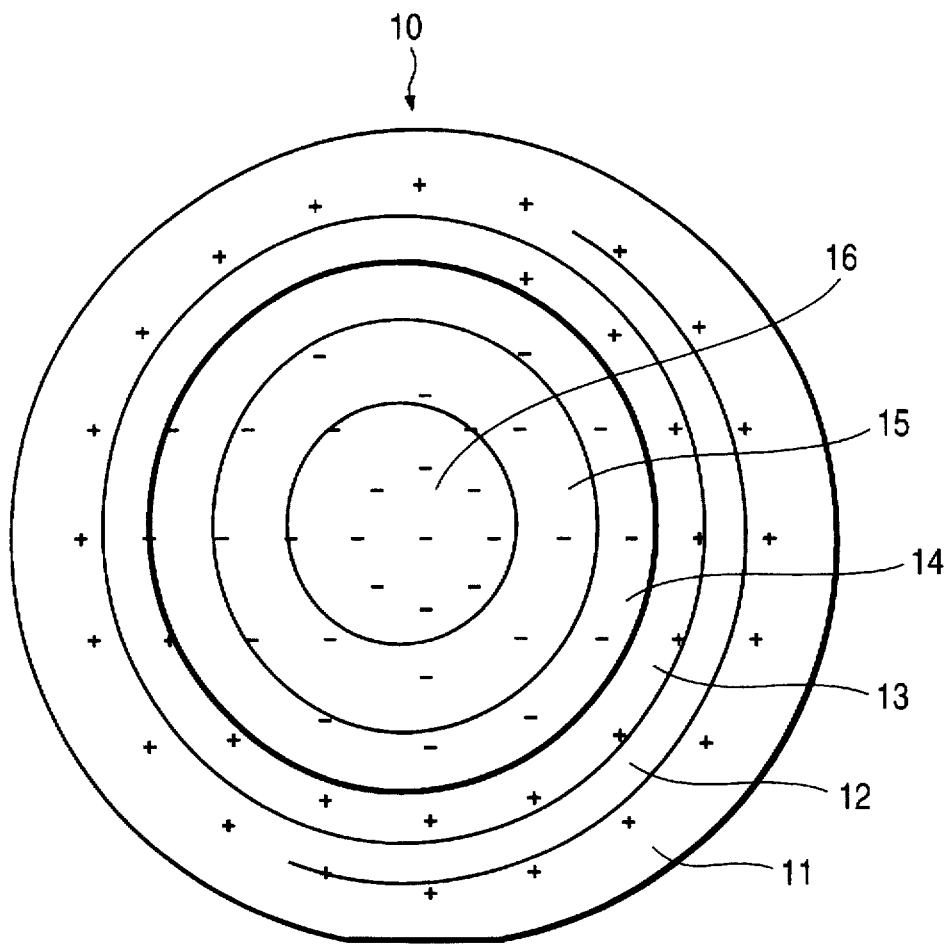
FIGS. 1 and 2 are resistance patterns of a film sputtered onto a silicon wafer using two different sputter machines.
Figure 2:
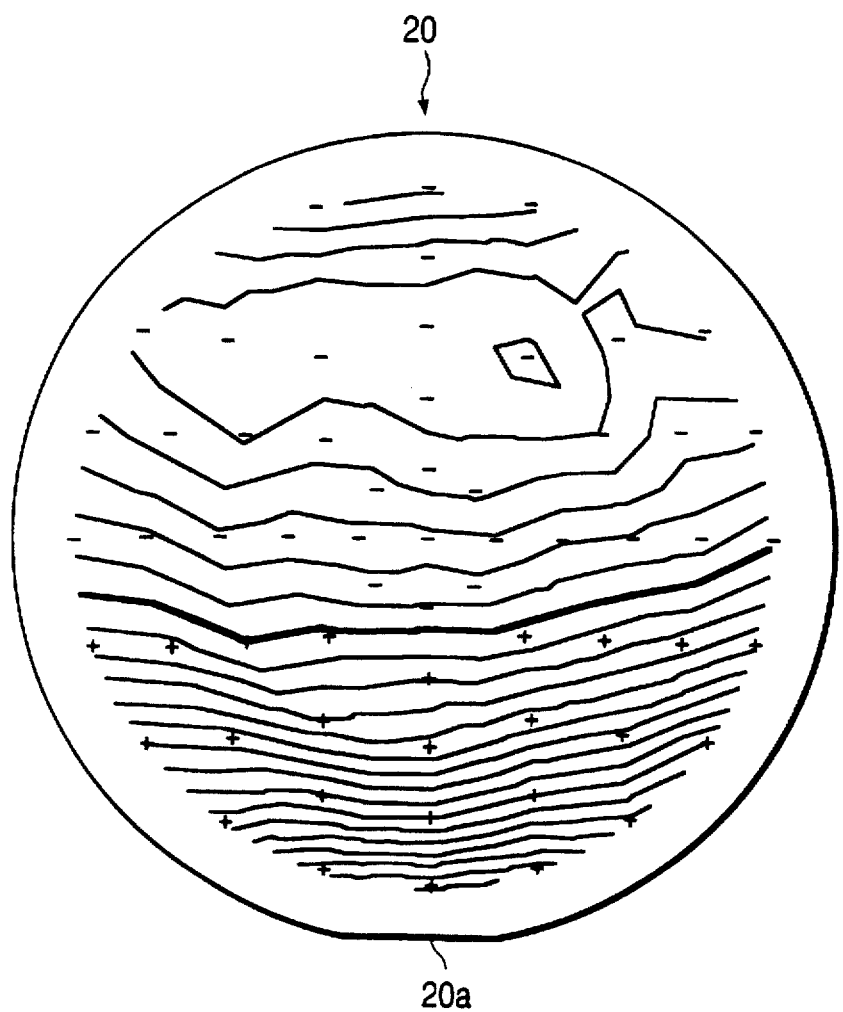
Figure 3:
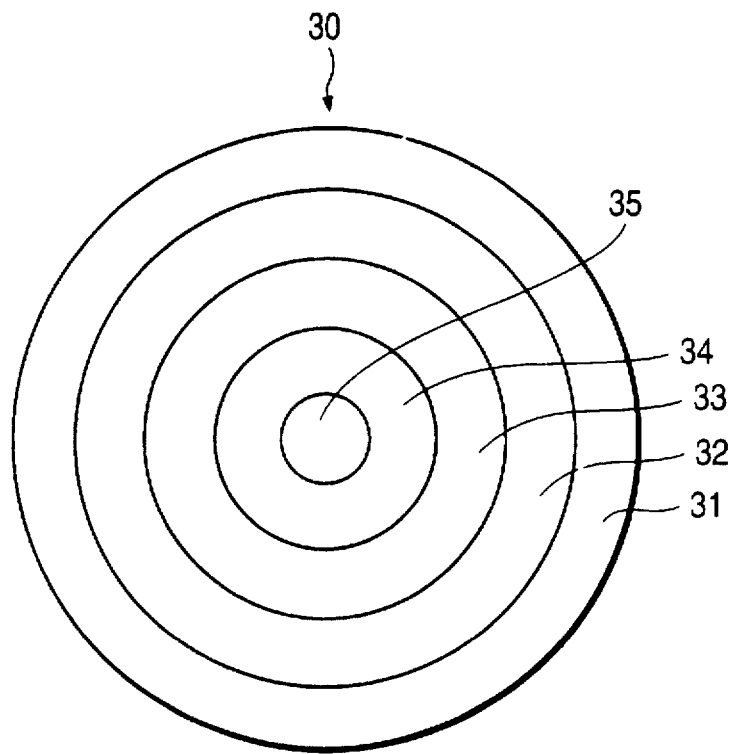
FIG. 3 is a multiple-zone resistance pattern of a film sputtered on a silicon wafer employed in one step in accordance with the present invention.
Figure 6:
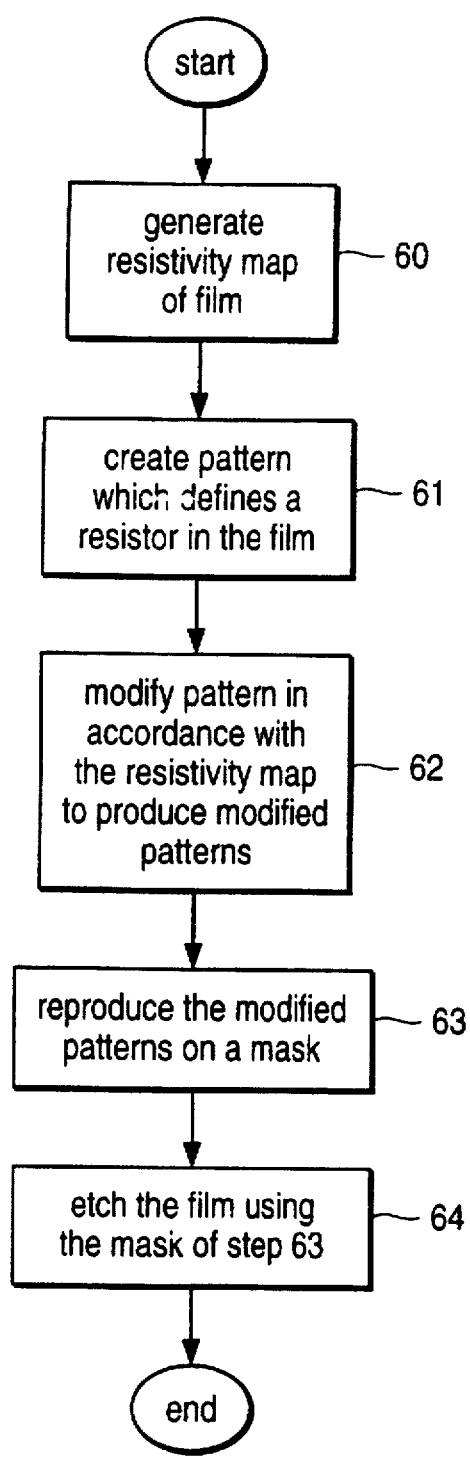
FIG. 6 is a flow chart illustrating process steps in accordance with the present invention.

FIG. 3 shows a resistivity map 30 of the resulting resistive film formed on the test wafer. Map 30 is prepared in a well known manner using a Prometrix Omnimap machine and includes five concentric zones 31–35 each encompassing a unique range of resistivities (see FIG. 6, step 60). Note that other resistivity mapping systems may be employed, and that such may be programmed so as to result in the generation of a different number of resistivity zones each of which encompassing a different range of resistivities. Further note that the specific geometries of such resistivity maps may vary between different sputter machines, between different sputter target materials, between different wafers, and even over time. Thus, it is emphasized that the following discussion is made with reference to FIGS. 3 and 4 for simplicity only and is in no way to be construed as limited to the specific examples provided herein.

In the example of FIG. 3, the sheet resistance of the resistive film increases as one moves outward from zone 35 to zone 31 along a diametric line extending from the center of map 30 to an outer edge of map 30. Zone 33 includes those portions of the film whose sheet resistance is approximately equal to the nominal value X $\Omega/\square$. The sheet resistance of portions of the film corresponding to zones 32 and 31 are approximately one percent and approximately two percent, respectively, greater than the nominal value X, while the sheet resistance of those portions of the film corresponding to zones 34 and 35 are approximately one percent and approximately two percent, respectively, less than the nominal value X. In this manner, patterns of variations in the sheet resistance of the resistive film may be readily determined.

Figure 4:
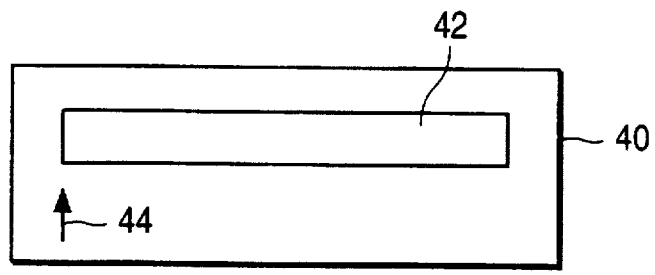
FIG. 4 is a reticle having a pattern formed therein employed in another step in accordance with the present invention.

Resistivity map 30 is then used in delineating the geometries of masking patterns used to define the film resistors so as to compensate for the process variations characteristic of the above-mentioned sputter machine. For instance, FIG. 4 shows a reticle 40 having a pattern 42 formed therein which defines a film resistor (step 61). Recall that where it is desired to form only film resistors on a wafer, a plurality of replicas of pattern 42 would in a conventional process be reproduced on a mask and used in subsequent exposure and etching steps to define a plurality of associated film resistors. In this manner, hundreds or thousands of such film resistors may be formed on a single wafer. Note that such replicas of pattern 42 may be reproduced in large numbers on the mask using a step and repeat process, a projection system, a software-controlled electron beam, or any other well known technique. As noted above, however, the value of each of such film resistors would vary depending upon where on the wafer, i.e., in which zone of the resistive film, the resistor is formed.

Figure 5:
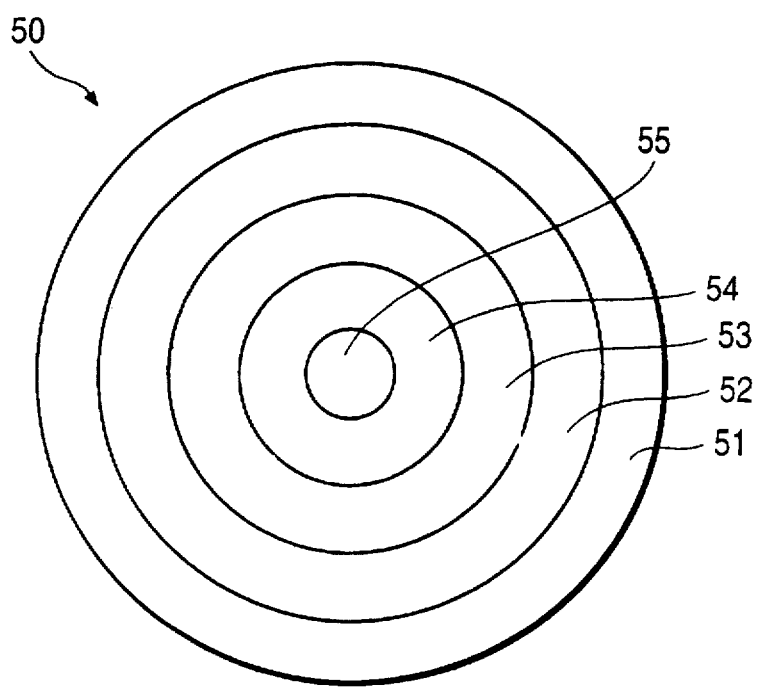
FIG. 5 is a mask having zones which precisely correspond in geometry and position to the zones of the map of FIG. 3.

In contrast, embodiments in accordance with the present invention call for patterns 42 to be modified in a manner depending upon where their associated film resistors are to be formed on the wafer (step 62). A number of zones which correspond to associated ones of zones 31–35 of map 30 are assigned to the mask that defines the film resistors. FIG. 5 shows a mask 50 having zones 51–55 which precisely correspond in geometry and position to the wafer as indicated by zones 31–35 of map 30. Since zone 33 of map 30 indicates that portions of the film associated therewith have a sheet resistance of approximately X $\Omega/\square$, identical images of pattern 42 are formed in portions of mask 50 lying within zone 53. Those portions of the film associated with zone 32 of map 30 have a sheet resistance of approximately one percent greater than X. Accordingly, it is desirable to increase the width of patterns 42 formed in zone 52 of mask 50 by approximately one percent. For example, if the width of pattern 42 as measured along axis 44 is 40 microns, then the width of the modified pattern formed within zone 52 of mask 50 and associated with zone 32 of the sputtered film is approximately 40.4 microns.

A modified pattern is created by increasing the width of pattern 42 by approximately one percent. This modified pattern is then reproduced in portions of mask 50 lying within zone 52 (step 63). In a similar manner, pattern 42 is again modified such that the surface area thereof is increased by approximately two percent and then reproduced in those portions of mask 50 lying within zone 51. Thus, with reference to the above example, the film resistors formed by these modified patterns lying within zone 51 of mask 50 have a width of approximately 40+(0.02)(40)=40.8 microns. This process is repeated in a manner consistent with that just described to form and produce additional modified patterns in those portions of mask 50 lying within zones 54 and 55 which correspond to respective zones 34 and 35 of resistivity map 30. In this manner, adjustments to the widths of the resultant film resistors, as defined in subsequent etching steps by patterns 42 and various modified patterns produced therefrom on mask 50 (step 64), compensate for variations in thickness of the film characteristic of the sputter machine used, thereby increasing the precision with which film resistors are made.

Note that since there may be some variation in thickness within portions of the film associated with zones 31–35 of map 30, the film resistors defined by patterns within a particular one of zones 51–55 of mask 50 may vary slightly in value. Accordingly, precision may be increased by assigning a greater number of zones to mask 50, thereby decreasing the range of values of those resistors defined by patterns within a particular zone.

The process variations characteristic of a particular sputter machine should not significantly change between runs. Thus, once the process variations characteristic of a particular sputter machine have been determined by a resistivity map and compensated for by modifying the patterns in the resistor mask as described above, no further adjustments to the resistor mask are necessary.

Recall that when sputtering a material onto a wafer, a target of the material is bombarded by ions such as Argon. As these ions strike the target, tiny pieces of the target material break off and fall to the wafer. As this target material is depleted over time, its surface area geometry changes, thereby changing the resultant sputter pattern. To compensate for this process variation, resistivity maps of the film are generated at predetermined intervals of time during the sputtering of material from the target. For each map so generated, a new mask having modified patterns 42 modified in accordance with the resistivity pattern illustrated by an associated resistivity map is created as described above. Once these new masks have been produced, a new target of the material is provided to the sputter machine. Then, at selected intervals (during depletion of the sputter target material) which correspond to the predetermined intervals at which the resistivity maps were prepared, a new mask containing the appropriately modified patterns 42 is rotated into usage. In this manner, principles of the present invention may compensate for variations in film thickness over time due to the changing geometries of a continuously-depleted target of material.

Note that the above discussed non-uniformities in deposition layers are usually much more influenced by the operating characteristics of the sputter machine than by the changing geometry of the target. As a result, the series of new masks containing appropriately modified patterns 42 created and the predetermined time intervals in which the new masks are rotated into usage may be employed for a series of targets. In other words, once a series of masks has been created which compensates for the changing target geometries, this series of masks may be used in the same manner with many different targets.

Where the operating characteristics of a sputter machine varies greatly between targets, occasional iterations to the masking patterns may be required. In those embodiments that employ an automated system which as described below converts a resistivity map into a file which, in turn, is used to generate a new mask, generations of these iterations should, excepting the cost fabricating a mask, require minimal time and expense.

Information indicative of variations in the thickness of a film sputtered onto a wafer may be gathered in ways other than generating a resistivity map. For instance, in some embodiments, the thickness of the film may be measured at selected points across the surface of the wafer. In other embodiments, the resultant film may be masked and then etched in a well known manner to form film resistors having identical intended values across a silicon wafer. Selected resistors are then probed in a well known manner to determine their actual resistances. In any of these embodiments, information indicative of variations of the thickness of a sputtered film are used to modify the mask patterns as described above. Note that present embodiments may be employed to selectively modify geometries of various patterns formed on an etchant mask in accordance with variations in film thickness, irrespective of the particular technique utilized to reproduce masking patterns onto the etchant mask, i.e., systems employing projection machines, software-controlled electron beams, and so on.

Note that principles of the present invention may be employed to compensate for process variations characteristic of other types of machines. For instance, variations in dopant concentrations across a surface area doped by, for instance, ion implantation may be compensated by first gathering data indicating the pattern of dopant level variation and, in accordance therewith, altering the masks used to define the geometries of the regions to be doped. Moreover, embodiments in accordance with the present invention may be adapted for use with machine which deposit layer onto substrates other than wafers such as, for instance, disks, flat panel displays, printed circuit boards, etc.

It is to be further noted that the above described embodiments process may be automated. For instance, software executed using a computer or processor may be employed to automatically convert a resistivity map into a mask having modified patterns formed in zones thereon which correspond to resistivity zones of the resistivity map. Such embodiments allow for a more automatic compensation of process variations associated with the deposition of material onto a wafer.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

We claim:

1. A method for forming at least one resistive element in a first film formed on a wafer, said method comprising:

generating data indicative of the resistivity of a second film as a function of position on said wafer;

creating a pattern defining a test resistive element;

modifying a width of said pattern to produce one or more modified patterns, said width being modified in accordance with said data so as to define said at least one resistive element;

reproducing said one or more modified patterns on a mask; and etching said first film using said mask containing said one or more modified patterns to form said at least one resistive element.

2. The method of claim 1, wherein said first and second films are the same film.

3. The method of claim 1, wherein said first and second films are different films.

4. The method claim 1, wherein said step of generating data comprises preparing a resistivity map of said second film.

5. The method of claim 1, wherein said step of generating said data comprises measuring the thickness of said second film at points on said wafer.

6. The method of claim 1, wherein said step of generating said data further comprises the steps of:

forming said test resistive element on said second film; and measuring the resistance of said test resistive element.

7. The method of claim 1, wherein:

said step of generating said data comprises assigning a plurality of first zones to said first film, each of said first zones corresponding to a predetermined range of resistivities of said second film;

said step of modifying comprises generating a plurality of groups of said one or more modified patterns, each of said plurality of groups being modified from said pattern in accordance with corresponding ones of said ranges of resistivities associated with respective ones of said plurality of first zones; and said step of reproducing further comprises the steps of:

assigning a plurality of second zones to said mask; and reproducing said groups of said one or more modified patterns on said mask, wherein each of said groups is formed within an associated one of said second zones assigned to said mask.

* * * * *